(12) United States Patent
Ahn et al.

(10) Patent No.: US 9,007,104 B2
(45) Date of Patent: Apr. 14, 2015

(54) APPARATUS FOR OUTPUT BUFFERING HAVING HALF-SWING RAIL-TO-RAIL STRUCTURE

(71) Applicant: MagnaChip Semiconductor, Ltd., Cheongju-si (KR)

(72) Inventors: Chang Ho Ahn, Cheongju-si (KR); Byung Jae Nam, Cheongju-si (KR); Sang Hyun Park, Cheongju-si (KR); Jae Hong Ko, Cheongju-si (KR); Hyun Jin Shin, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/198,955

(22) Filed: Mar. 6, 2014

(65) Prior Publication Data
US 2014/0312949 A1   Oct. 23, 2014

(30) Foreign Application Priority Data

Apr. 19, 2013   (KR) .......................... 10-2013-0043759

(51) Int. Cl.
*H03K 3/00*   (2006.01)
*H03K 5/12*   (2006.01)

(52) U.S. Cl.
CPC ........................................ *H03K 5/12* (2013.01)

(58) Field of Classification Search
CPC ......... H03K 5/01; H03K 5/12; H03K 19/0005; H03K 19/0008; H03K 2005/0078; H03K 2005/00293; H04L 25/03834
USPC ................... 327/108, 112, 170–172, 261–264
See application file for complete search history.

(56) References Cited

U.S. PATENT DOCUMENTS

| 6,014,054 | A  | * | 1/2000 | Kawakita et al. | ............. | 327/563 |
| 6,229,380 | B1 | * | 5/2001 | Hedberg         | ............. | 327/536 |
| 7,728,688 | B2 | * | 6/2010 | Shor            | ............. | 331/185 |
| 8,008,952 | B2 | * | 8/2011 | Kurokawa        | ............. | 327/108 |

* cited by examiner

*Primary Examiner* — An Luu
(74) *Attorney, Agent, or Firm* — NSIP Law

(57) ABSTRACT

There is provided an apparatus for output buffering having a half-swing rail-to-rail structure. The apparatus provides output buffering by using a switch structure in order to attain a high slew rate and low power characteristics, thereby reducing current consumption. The provided apparatus for output buffering having a half-swing rail-to-rail structure includes a first output buffer, driven between a first voltage rail and a second voltage rail and outputting a first output signal in response to a first input signal and a second input signal, and a second output buffer, driven between the first and the second voltage rails and a third voltage rail and outputting a second output signal in response to a third input signal and a fourth input signal.

24 Claims, 8 Drawing Sheets

APPARATUS FOR OUTPUT BUFFERING HAVING HALF-SWING RAIL-TO-RAIL STRUCTURE

CROSS-REFERENCE TO RELATED APPLICATIONS

This application claims the benefit under 35 U.S.C. §119 (a) of Korean Patent Application No. 10-2013-0043759 filed on Apr. 19, 2013, in the Korean Intellectual Property Office, the entire disclosure of which is incorporated herein by reference for all purposes.

BACKGROUND

1. Field

The following description relates to an apparatus for output buffering having a half-swing rail-to-rail structure, and more specifically to an apparatus for output buffering having a half-swing rail-to-rail structure that features a high slew rate and low power consumption.

2. Description of Related Art

Generally, for an integrated circuit (IC) to drive a panel of display device, a slew rate is arising as an important factor in its operation, due to an increase of load capacitance and a reduction of horizontal period, according to the increase. In electronics, a slew rate is defined as the maximum rate of change of output voltage per unit time. Such an integrated circuit may be referred to as a Display Driver IC (DDI) or display driver device.

Also, from the viewpoint of a mounting environment of a panel DDI, conventionally, a Source IC was configured to drive one liquid crystal. More recently, a Source IC may drive three liquid crystals, which requires that an IC drives two more liquid crystals. Due to these increased demands that are placed on the DDI, realization of a fast slewing time becomes necessary.

Also, a display driver device may be designed to feature a reduction of current consumption, a high slew rate, a fast slewing time, or a fast settling time, since realization of fast slewing time and low power consumed therein are also design goals of a display driver device.

FIG. 1 illustrates a plan view indicating a Liquid Crystal Display device.

A Liquid Crystal Display device (LCD) offers advantages such as miniaturization, thinness and low power consumption. Hence, LCD technology is used, for example, for an LCD screen panel of a notebook computer and an LCD TV. Specifically, an LCD device, whose type is active matrix uses a Thin Film Transistor (TFT) as a switch element and is a display technology that is suitable for displaying a moving image.

When referring to FIG. 1, a Liquid Crystal Display device (LCD) 1 comprises a liquid crystal panel 2, source drivers (SD) having many source lines (SL) respectively, and gate drivers (GD) having many gate lines (GL) respectively. A source line (SL) may be referred to a data line or a channel.

Each of the source drivers (SD) drives source lines (SL) arranged on the liquid crystal Panel 2. Each of the gate drivers (GD) drives gate lines (GL) arranged on a liquid crystal panel 2.

The Liquid crystal Panel 2 comprises many pixels 3. Each of the pixels 3 comprises a switch transistor (TR), a storage capacitor (CST) for reducing a current leakage from the liquid crystal, and a liquid crystal capacitor (CLC). A switch transistor (TR) is turned on and turned off in response to a signal driving a gate line (GL). A terminal of the switch transistor (TR) that is turned on and turned off by the signal from the gate line (GL) is connected to a source line (SL).

A storage capacitor (CST) is connected between another terminal of the switch transistor (TR) and a grounding voltage (VSS), and the liquid crystal capacitor (CLC) is connected between another terminal of the switch transistor (TR) and a common voltage (VCOM). In an example, the common voltage (VCOM) is a power voltage, such as VDD/2.

The load of each of the source lines (SL) connected to the pixels 3 arranged on the liquid crystal panel 2 may be modeling by representing it using parasitic resistors and parasitic capacitors.

FIG. 2 illustrates a schematic view indicating an apparatus for output buffering.

When referring to FIG. 2, a source driver 50 includes an output buffer 10, an output switch 11, an output protection resistor 12 and a load 13 connected to a source line. The output buffer 10 delivers an analog moving image signal to a corresponding output switch 11 for amplification. The output switch 11 outputs the amplified analog moving image signal as a signal driving a source line, in response to an activation of a signal controlling an output switch, such as switch (OSW) and/or switch (OSWB). The signal driving source line is provided with the load 13 connected to the source line. As illustrated in FIG. 2, the load 13 is modeled as parasitic resistors (RL1 to RL5) and parasitic capacitors (CL1 to CL5) such that the parasitic resistors (RL1 to RL5) and parasitic capacitors (CL1 to CL5) are connected in a ladder type structure.

However, according to this example approach, the output switch 11 has a plurality of transmission switches. Therefore, a slew rate becomes low, due to a resistance element resulting from the use of the plurality of transmission switches. Thus, the slewing time increases, which potentially interferes with the functionality of the device. Also, another issue that occurs is that elevating the slew rate potentially increases current consumption, which may also be detrimental to the functionality of the device.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The present disclosure has an objective to provide an apparatus for output buffering having a half-swing rail-to-rail structure, configured to feature a high slew rate and low power by improving an output buffer and a switch structure of the apparatus.

In one general aspect, an apparatus for output buffering having a half-swing rail-to-rail structure includes a first output buffer configured to be driven between a first voltage rail and a second voltage rail, and output a first output signal in response to a first input signal and a second input signal, and a second output buffer configured to be driven between the first and the second voltage rails and a third voltage rail, and output a second output signal in response to a third input signal and a fourth input signal.

The second output buffer may include an input stage configured to receive an input high power voltage and an input low power voltage from the second voltage rail and the third voltage rail, respectively, and generate a delivery signal corresponding to an input signal, and an output stage configured to receive an output high power voltage and an output low power voltage from the first voltage rail and the third voltage rail, respectively, and output the second output signal corresponding to the delivery signal.

The voltage level of the output high power voltage may be higher than that of the input high power voltage, and the voltage level of the output low power voltage may be identical to that of the input low power voltage.

The first output buffer may include an input stage configured to receive an input high power voltage and an input low power voltage from the first voltage rail and the second voltage rail, and generate a delivery signal corresponding to an input signal, and an output stage configured to receive an output high power voltage and an output low power voltage from the first voltage rail and the second voltage rail, and output the first output signal corresponding to the delivery signal.

The voltage level of the output high power voltage may be identical to that of the input high power voltage, and a voltage level of the output low power voltage may be identical to that of the input low power voltage.

A voltage value of the second voltage rail may be a half voltage value between the first voltage rail and the third voltage rail.

In another general aspect, an apparatus for output buffering having a half-swing rail-to-rail structure includes a first output buffer configured to be driven between a first voltage rail and a second voltage rail, and output a first output signal in response to a first input signal and a second input signal, an eleventh switch configured to provide the first input signal for a first input terminal of the first output buffer, a twelfth switch configured to provide the second input signal for a second input terminal of the first output buffer, a second output buffer configured to be driven between the first, second voltage rails and the third voltage rail, and output a second output signal in response to a third input signal and a fourth input signal, a thirteenth switch configured to provide the third input signal for the first input terminal of the second output buffer, and a fourteenth switch configured to provide the fourth input signal for the second input terminal of the second output buffer.

The apparatus may further include a twenty-first switch configured to feed back the first output signal to the first input terminal of the first output buffer, a twenty-second switch configured to feed back the first output signal to the second input terminal of the first output buffer, a twenty-third switch configured to feed back the second output signal to the first input terminal of the second output buffer, and a twenty-fourth switch configured to feed back the second output signal to the second input terminal of the second output buffer.

The apparatus may further include a thirty-first switch configured to provide the first output signal for the first panel, a thirty-third switch configured to provide the first output signal for the second panel, a thirty-second switch configured to provide the second output signal for the first panel, and a thirty-fourth switch configured to provide the second output signal for the second panel.

Each switch of the eleventh to fourteenth switch, the twenty-first to twenty-fourth switch, and the thirty-first to thirty-fourth switch may be provided with voltage from the first voltage rail and the second voltage rail by a positive decoder and a negative decoder, the eleventh and twelfth switch may both be provided with voltage from the first voltage rail or the second voltage rail by the positive decoder and the twenty-first and twenty-second switch may both be provided with voltage from the first voltage rail or the second voltage rail by the positive decoder, the thirteenth and fourteenth switch may both be provided with voltage from the first voltage rail or the second voltage rail by the negative decoder and the twenty-third and twenty-fourth switch may both be provided with voltage from the first voltage rail or the second voltage rail by the negative decoder, and the thirty-first and thirty-second switch may both be provided with voltage from the first voltage rail by the positive decoder and the thirty-third and thirty-fourth switch may both be provided with voltage from the first voltage rail by the negative decoder.

Thus, each switch of a first to a third switch groups may be provided with voltage from the first voltage rail and the second voltage rail selectively from combinations illustrated in Table 1, below.

The apparatus may further include a fortieth switch configured to make the first panel and the second panel separate from each other.

The apparatus may further include a plurality of regulators, formed at an external printed circuit board (PCB) or integrated circuit (IC), and connected in a row to selectively provide a driving voltage for the first to the third voltage rails.

In another general aspect, an apparatus for output buffering having a half-swing rail-to-rail structure, includes a first output buffer configured to be driven between the first voltage rail and the second, third voltage rails, and output a first output signal in response to a first input signal and a second input signal, and a second output buffer configured to be driven between the second voltage rail and the third voltage rail, and output a second output signal in response to the third input signal and the fourth input signal.

The first output buffer may include an input stage configured to receive an input high power voltage and an input low power voltage from the first voltage rail and the second voltage rail, and generate a delivery signal corresponding to an input signal, and an output stage configured to receive an output high power voltage and an output low power voltage from the first voltage rail and the third voltage rail, and output the second output signal corresponding to the delivery signal.

A voltage level of the output high power voltage may be identical to that of the input high power voltage, and a voltage level of the output low power voltage may be lower than that of the input low power voltage.

The second output buffer may include an input stage configured to receive an input high power voltage and an input low power voltage from the second voltage rail and the third voltage rail, and generate a delivery signal corresponding to an input signal, and an output stage configured to receive an output high power voltage and an output low power voltage from the second voltage rail and the third voltage rail, and output the second output signal corresponding to the delivery signal.

The voltage level of the output high power voltage may be identical to that of the input high power voltage, and the voltage level of the output low power voltage may be identical to that of the input low power voltage.

A voltage value of the second voltage rail may be a half voltage value between the first voltage rail and the third voltage rail.

In another general aspect, an apparatus for output buffering having a half-swing rail-to-rail structure includes a first output buffer configured to be driven between the first voltage rail, the second voltage rail, and the third voltage rail, and output a first output signal in response to a first input signal and a second input signal, a fifty-first switch configured to provide the first input signal for the first input terminal of the first output buffer, a fifty-second switch configured to provide the second input signal for the second input terminal of the first output buffer, a second output buffer configured to be driven between the second voltage rail and the third voltage rail, and output a second output signal in response to the third input signal and the fourth input signal, a fifty-third switch configured to provide the third input signal for the first input terminal of the second output buffer, and a fifty-fourth switch configured to provide the fourth input signal for the second input terminal of the second output buffer.

The apparatus may further include a sixty-first switch configured to feed back the first output signal to the first input terminal of the first output buffer, a sixty-second switch configured to feed back the first output signal to the second input terminal of the first output buffer, a sixty-third switch configured to feed back the second output signal to the first input terminal of the second output buffer, and a sixty-forth switch configured to feed back the second output signal to the second input terminal of the second output buffer.

The apparatus may further include a seventy-first switch configured to provide the first output signal for the first panel, a seventy-third switch configured to provide the first output signal for the second panel, a seventy-second switch configured to provide the second output signal for the first panel, and a seventy-fourth switch configured to provide the second output signal for the second panel.

Each switch of the fifty-first to fifty-fourth switch, the sixty-first to sixty-fourth switch, and the seventy-first to seventy-fourth switch may be provided with voltage from the first voltage rail and the second voltage rail by a positive decoder and a negative decoder, the fifty-first and fifty-second switch may both be provided with voltage from the first voltage rail or the second voltage rail by the positive decoder and the sixty-first and sixty-second switch may both be provided with voltage from the first voltage rail or the second voltage rail by the positive decoder, the fifty-third and fifty-fourth switch may both be provided with voltage from the first voltage rail or the second voltage rail by the negative decoder and the sixty-third and sixty-fourth switch may both be provided with voltage from the first voltage rail or the second voltage rail by the negative decoder, and the seventy-first and seventy-second switch may both be provided with voltage from the first voltage rail by the positive decoder and the seventy-third and seventy-fourth switch may both be provided with voltage from the first voltage rail by the negative decoder.

Thus, each switch of a fifth to a seventh switch groups may be provided with voltage from the first voltage rail and the second voltage rail selectively from combinations illustrated in Table 2, below.

The apparatus may further include an eightieth switch making the first panel and the second panel separate from each other.

The apparatus may further include a first regulator and a second regulator, formed at an external printed circuit board (PCB) or integrated circuit (IC) configured to selectively provide a driving voltage for the first to the third voltage rails.

According to the apparatus for output buffering having a half-swing rail-to-rail structure of the present disclosure as described above, effects are provided, in which a current consumption can be reduced by improving a structure for supplying a voltage to the output buffer and improving an external switch structure connected with the output buffer and thereby making the switch structure be selectively driven with respect to the first, second, and third voltages, and thus, the high slew rate and lower power features can be enhanced.

Figure 1:
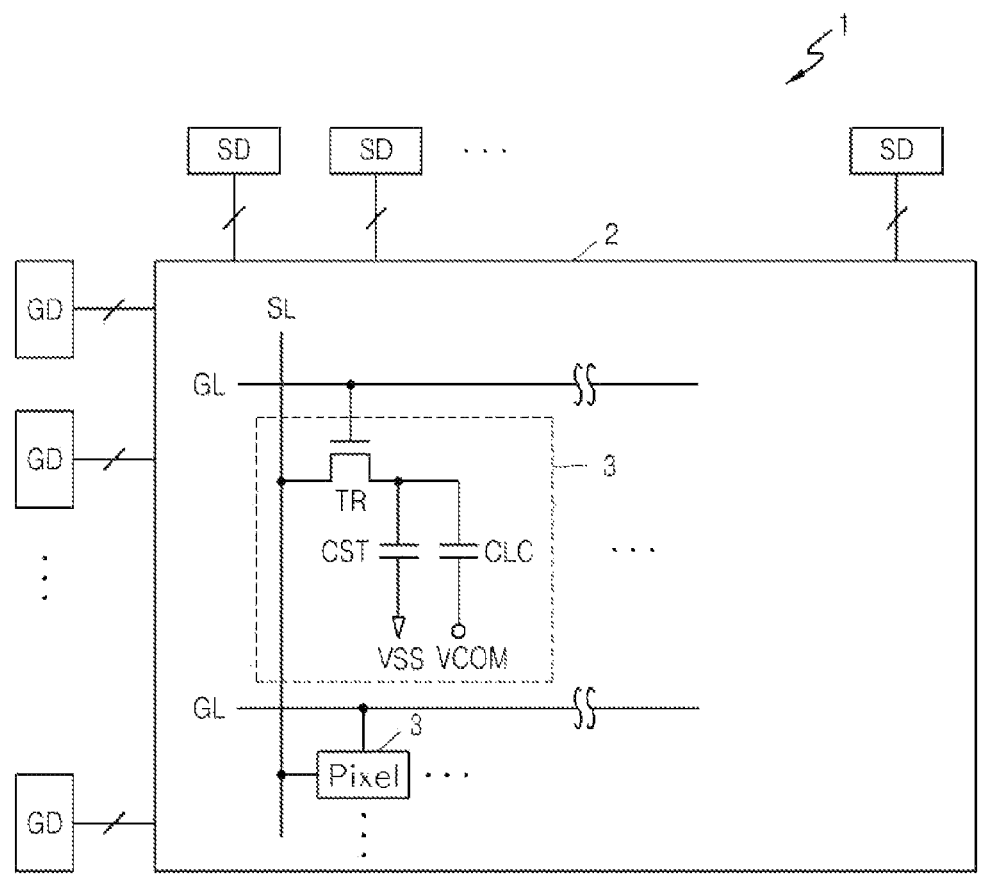
FIG. 1 illustrates a plan view indicating a liquid crystal display device.
Figure 2:
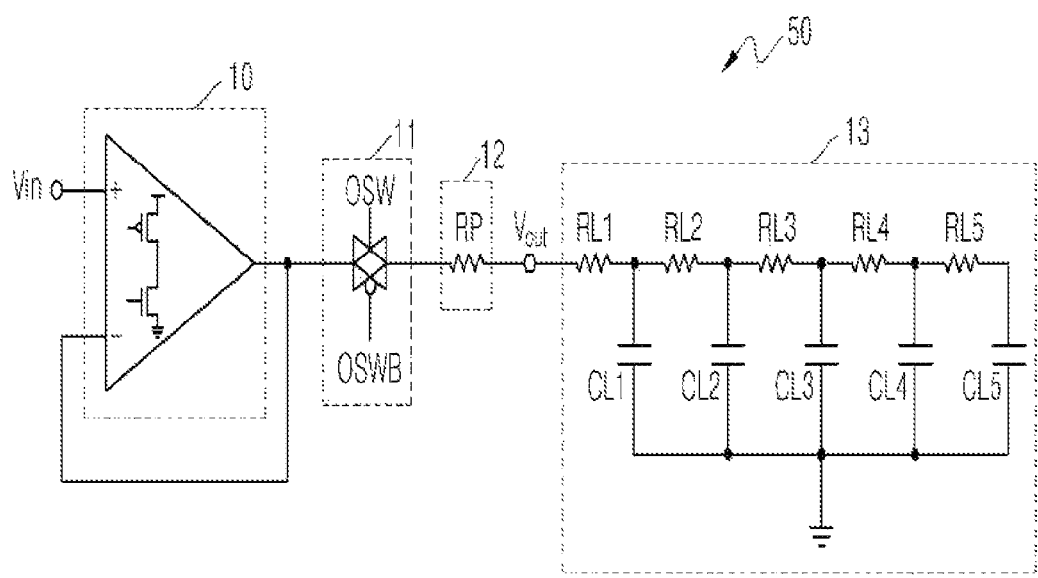
FIG. 2 illustrates a schematic view indicating an apparatus for output buffering.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 3:
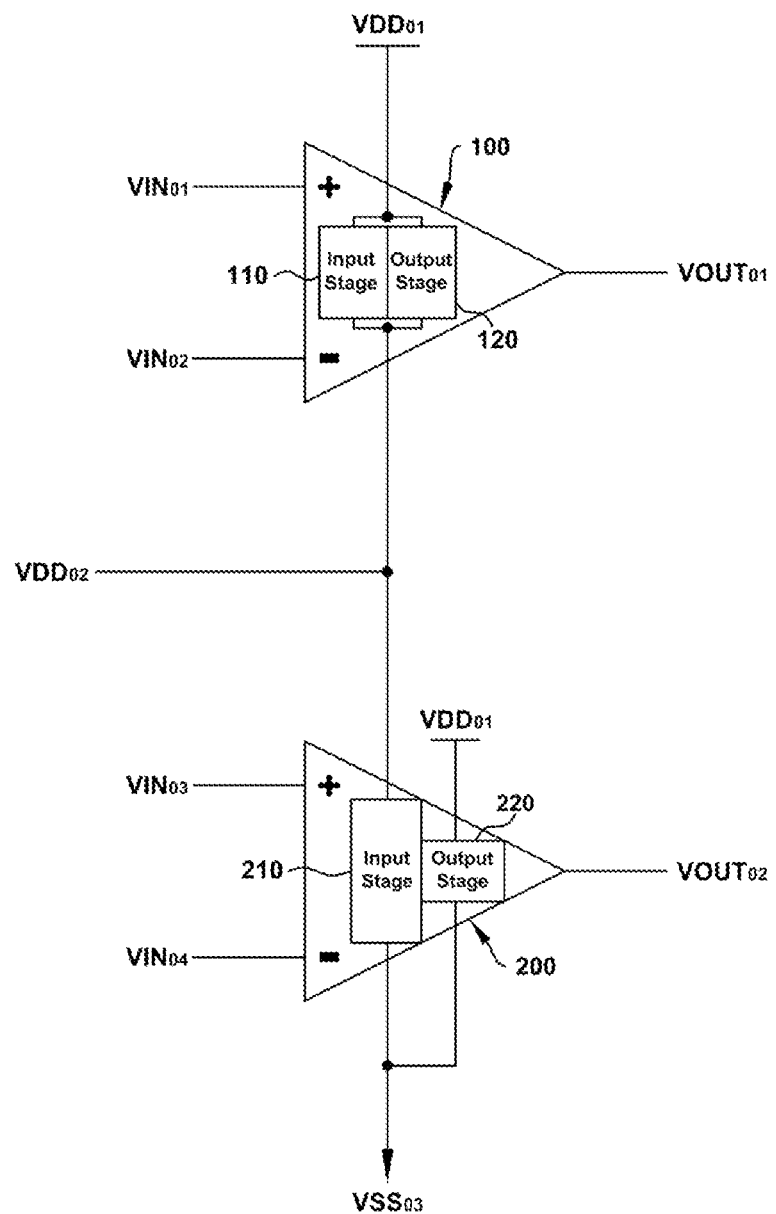
FIG. 3 illustrates a plan view of an apparatus for output buffering having a half-swing rail-to-rail structure, according to an embodiment.

FIG. 3 illustrates a plan view of an apparatus for output buffering having a half-swing rail-to-rail structure, according to an embodiment.

As illustrated, the apparatus for output buffering having a half-swing rail-to-rail structure, according to an embodiment, includes two buffers. One of the buffers is a first output buffer 100 having a first input signal ($VIN_{01}$), a second input signal ($VIN_{02}$) and a first output signal ($VOUT_{01}$). The other buffer is a second output buffer 200 having a third input signal ($VIN_{03}$), a fourth input signal ($VIN_{04}$) and a second output signal ($VOUT_{02}$).

The first output buffer 100 and second output buffer 200 are driven by any of the one or more voltages provided from the first voltage rail ($VDD_{01}$), the second voltage rail ($VDD_{02}$), and the third voltage rail ($VSS_{03}$).

Thus, a first output buffer 100 is driven between a first voltage rail ($VDD_{O1}$) and a second voltage rail ($VDD_{O2}$), and outputs a first output signal ($VOUT_{O1}$) in response to a first input Signal ($VIN_{O1}$) and a second input signal ($VIN_{O2}$).

Furthermore, a second output buffer 200 is driven between the first and second voltage rails ($VDD_{O1}$, $VDD_{O2}$) and a third voltage rail ($VSS_{O3}$), and outputs a second output signal ($VOUT_{O2}$) in response to a third input signal ($VIN_{O3}$) and a fourth input signal ($VIN_{O4}$).

For example, the second output buffer 200 includes several constituent elements. In an example, the constituent elements include an input stage 210 and an output stage 220.

The input stage 210 is configured to receive an input high power voltage and an input low power voltage from the second voltage rail ($VDD_{O2}$) and the third voltage rail ($VSS_{O3}$) and generate a delivery signal corresponding to an input signal.

The output stage 220 is configured to receive an output high power voltage and an output low power voltage from the first voltage rail ($VDD_{O1}$) and the third voltage rail ($VSS_{O3}$), and output the second output signal corresponding to the delivery signal.

Thus, in an example, a voltage level of the output high power voltage is higher than that of the input high power voltage, and a voltage level of the output low power voltage is identical to that of the input low power voltage.

Additionally, the first output buffer 100 includes two stages, an input stage 110 and an output stage 120. The input stage 110 is configured to receive an input high power voltage and an input low power voltage from the first voltage rail ($VDD_{O1}$) and the second voltage rail ($VDD_{O2}$), and to generate a delivery signal corresponding to an input signal.

The output stage 120 is configured to receive an output high power voltage and an output low power voltage from the first voltage rail ($VDD_{O1}$) and the second voltage rail ($VDD_{O2}$), and to output the first output signal corresponding to the delivery signal.

Thus, in an example, a voltage level of the output high power voltage is identical to that of the input high power voltage, and a voltage level of the output low power voltage is identical to that of the input low power voltage.

Also, in another example, a voltage value of the second voltage rail ($VDD_{O2}$) is instead a half voltage value between the voltage values of the first voltage rail ($VDD_{O1}$) and of the third voltage rail ($VSS_{O3}$).

As an example, when the first voltage rail ($VDD_{O1}$) is +10V and the third voltage rail ($VSS_{O3}$) is 0V, the second voltage rail ($VDD_{O2}$) is 5V. Alternatively, when the first voltage rail ($VDD_{O1}$) is +10V and the third voltage rail ($VSS_{O3}$) is −10V, the second voltage rail ($VDD_{O2}$) is 0V.

Figure 4:
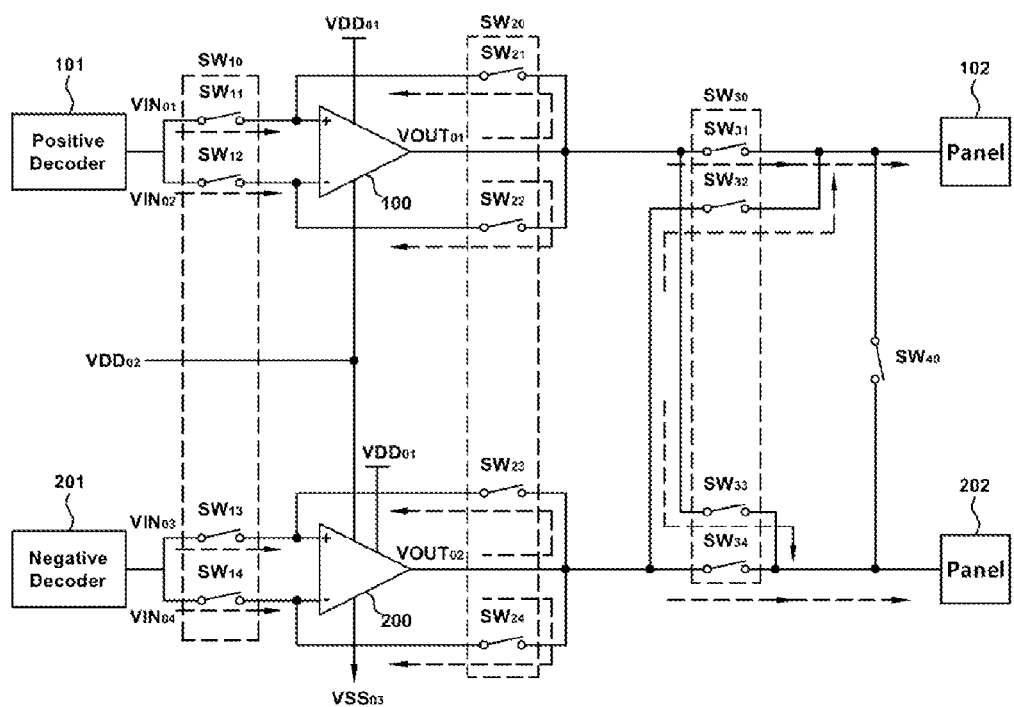
FIG. 4 illustrates a plan view indicating an apparatus in which a switch structure for an offset cancellation is added to the apparatus for output buffering illustrated in FIG. 3, according to an embodiment.

FIG. 4 illustrates a plan view indicating an apparatus in which a switch structure for an offset cancellation is added to the apparatus for output buffering illustrated in FIG. 3, according to an embodiment.

As illustrated, in various examples, circuits for supplying a voltage and for feedback are configured by adding an eleventh to a fourteenth switch ($SW_{11}$, $SW_{12}$, $SW_{13}$, $SW_{14}$) and a twenty-first to a twenty-fourth switch ($SW_{21}$, $SW_{22}$, $SW_{22}$, $SW_{24}$) to the first output buffer 100 and the second output buffer 200.

As illustrated in FIG. 3, the first output buffer 100 is driven between the first voltage rail ($VDD_{O1}$) and the second voltage rail ($VDD_{O2}$). The first output buffer 100 outputs the first output signal ($VOUT_{O1}$) in response to the first input signal ($VIN_{O1}$) and the second input signal ($VIN_{O2}$).

Thus, the eleventh switch ($SW_{11}$) provides the first input signal ($VIN_{O1}$) for a first input terminal (+) of the first output buffer 100, and the twelfth switch ($SW_{12}$) provides the second input signal ($VIN_{O2}$) for a second input terminal (−) of the first output buffer 100.

Further, as illustrated in FIG. 3, the second output buffer 200 is driven between the first and second voltage rails ($VDD_{O1}$, $VDD_{O2}$) and the third voltage rail ($VSS_{O3}$). The second output buffer 200 outputs a second output signal ($VOUT_{O2}$) in response to a third input signal ($VIN_{O3}$) and a fourth input signal ($VIN_{O4}$).

Thus, a thirteenth switch ($SW_{13}$) provides the third input signal ($VIN_{O3}$) for the first input terminal (+) of the second output buffer 200. Additionally, a fourteenth switch ($SW_{14}$) provides the fourth input signal ($VIN_{O4}$) for the second input terminal (−) of the second output buffer 200.

Additionally, a twenty-first switch ($SW_{21}$) feeds back the first output signal ($VOUT_{O1}$) to the first input terminal (+) of the first output buffer 100. A twenty-second switch ($SW_{22}$) feeds back the first output signal ($VOUT_{O1}$) to the second input terminal (−) of the first output buffer 100, a twenty-third switch ($SW_{23}$) feeds back the second output signal ($VOUT_{O2}$) to the first input terminal (+) of the second output buffer 200, and a twenty-fourth switch ($SW_{24}$) feeds back the second output signal ($VOUT_{O2}$) to the second input terminal (−) of the second output buffer 200.

Furthermore, the apparatus for output buffering having a half-swing rail-to-rail structure includes additional switches. The apparatus includes a thirty-first switch ($SW_{31}$) providing the first output signal ($VOUT_{O1}$) for the first panel 102, a thirty-third switch ($SW_{33}$) providing the first output signal ($VOUT_{O1}$) for the second panel 202, a thirty-second switch ($SW_{32}$) providing the second output signal ($VOUT_{O2}$) for the first panel 102, and a thirty-fourth switch ($SW_{34}$) providing the Second Output Signal ($VOUT_{O2}$) for the second panel 202.

The apparatus for output buffering having a half-swing rail-to-rail structure further includes a fortieth switch ($SW_{40}$) making the first panel 102 and the second panel 202 separate from each other.

In various examples, each of the switches is provided with voltage from the first voltage rail ($VDD_{O1}$) and the second voltage rail ($VDD_{O2}$) selectively. Suppliable combinations of input voltage according to various embodiments are presented as below Table 1.

TABLE 1

| Item | First Switch Group SW10 | | | | Second Switch Group SW20 | | | | Third Switch Group SW30 | | | |
| --- | --- | --- | --- | --- | --- | --- | --- | --- | --- | --- | --- | --- |
| Type of Decoder | Positive Decoder | | Negative Decoder | | Positive Decoder | | Negative Decoder | | Positive Decoder | | Negative Decoder | |
| Switch | $SW_{11}$ | $SW_{12}$ | $SW_{13}$ | $SW_{14}$ | $SW_{21}$ | $SW_{22}$ | $SW_{23}$ | $SW_{24}$ | $SW_{31}$ | $SW_{32}$ | $SW_{33}$ | $SW_{34}$ |
| Embodiment 1A | HV | HV | HV | HV | HV | HV | HV | HV | HV | HV | HV | HV |
| Embodiment 1B | | | | | HV | HV | MV | MV | | | | |

TABLE 1-continued

| Item | First Switch Group SW10 | | | | Second Switch Group SW20 | | | | Third Switch Group SW30 | | | |
|---|---|---|---|---|---|---|---|---|---|---|---|---|
| Type of Decoder | Positive Decoder | | Negative Decoder | | Positive Decoder | | Negative Decoder | | Positive Decoder | | Negative Decoder | |
| Switch | $SW_{11}$ | $SW_{12}$ | $SW_{13}$ | $SW_{14}$ | $SW_{21}$ | $SW_{22}$ | $SW_{23}$ | $SW_{24}$ | $SW_{31}$ | $SW_{32}$ | $SW_{33}$ | $SW_{34}$ |
| Embodiment 1C | | | | | MV | MV | MV | MV | | | | |
| Embodiment 2A | HV | HV | MV | MV | HV | HV | HV | HV | | | | |
| Embodiment 2B | | | | | HV | HV | MV | MV | | | | |
| Embodiment 2C | | | | | MV | MV | MV | MV | | | | |
| Embodiment 3A | MV | MV | MV | MV | HV | HV | HV | HV | | | | |
| Embodiment 3B | | | | | HV | HV | MV | MV | | | | |
| Embodiment 3C | | | | | MV | MV | MV | MV | | | | |

In Table 1, HV denotes a supply voltage provided by a first voltage rail ($VDD_{01}$) and MV denotes a supply voltage provided by a second voltage rail ($VDD_{02}$).

In embodiments, certain switches ($SW_{11}$, $SW_{12}$, $SW_{21}$, $SW_{22}$, $SW_{31}$, $SW_{32}$) are provided selectively with supply voltages of the first voltage rail ($VDD_{01}$) and the second voltage rail ($VDD_{02}$) from a positive decoder 101. Additionally, certain other switches ($SW_{13}$, $SW_{14}$, $SW_{23}$, $SW_{24}$, $SW_{33}$, $SW_{34}$) are provided selectively with supply voltages of the first voltage rail ($VDD_{01}$) and the second voltage rail ($VDD_{02}$) from a negative decoder 201.

Therefore, as illustrated in the embodiment 1A of Table 1, a twenty-first to a twenty-fourth switch ($SW_{21}$, $SW_{22}$, $SW_{23}$, $SW_{24}$) are provided with HV in a lump, under the condition that an eleventh to a fourteenth switch ($SW_{11}$, $SW_{12}$, $SW_{13}$, $SW_{14}$) are provided with HV.

Additionally, as illustrated in the embodiment 1B of Table 1, a twenty-first and a twenty-second switch ($SW_{21}$, $SW_{22}$) are provided with HV from a positive decoder 101 and a twenty-third and a twenty-fourth switch ($SW_{23}$, $SW_{24}$) are provided with MV selectively from a negative decoder 201, under the condition that an eleventh to a fourteenth switch ($SW_{11}$, $SW_{12}$, $SW_{13}$, $SW_{14}$) are provided with HV as described above.

As another alternative, as illustrated in the embodiment 1C of Table 1, a twenty-first to a twenty-fourth switches ($SW_{21}$, $SW_{22}$, $SW_{23}$, $SW_{24}$) are provided with MV in a lump, under the condition that an eleventh to a fourteenth switch ($SW_{11}$, $SW_{12}$, $SW_{13}$, $SW_{14}$) are provided with HV.

In these embodiments, the thirty-first to the thirty-fourth switch ($SW_{31}$, $SW_{32}$, $SW_{33}$, $SW_{34}$) are provided with HV at all times.

Further, as illustrated in the embodiment 2A of Table 1, a twenty-first to a twenty-fourth switch ($SW_{21}$, $SW_{22}$, $SW_{23}$, $SW_{24}$) are provided with HV in a lump, under the condition that an eleventh and a twelfth switch ($SW_{11}$, $SW_{12}$) are provided with HV from a positive decoder 101 and a thirteenth and a fourteenth switch ($SW_{13}$, $SW_{14}$) are provided with MV selectively from a negative decoder 201.

Additionally, as illustrated in the embodiment 2B of Table 1, a twenty-first and a twenty-second switches ($SW_{21}$, $SW_{22}$) are provided with HV from a positive decoder 101 and a twenty-third and a twenty-fourth switch ($SW_{23}$, $SW_{24}$) may be provided with MV selectively from a negative decoder 201, under the condition that an eleventh and a twelfth switch ($SW_{11}$, $SW_{12}$) are provided with HV from a positive decoder 101 and a thirteenth and a fourteenth switch ($SW_{13}$, $SW_{14}$) are provided with MV selectively from a negative decoder 201.

As another alternative, as illustrated in the embodiment 2C of Table 1, a twenty-first to a twenty-fourth switch ($SW_{21}$, $SW_{22}$, $SW_{23}$, $SW_{24}$) are provided with MV in a lump, under the condition that an eleventh and a twelfth switch ($SW_{11}$, $SW_{12}$) are provided with HV from a positive decoder 101 and a thirteenth and a fourteenth switch ($SW_{13}$, $SW_{14}$) are provided with MV selectively from a negative decoder 201.

In these embodiments, the thirty-first to the thirty-fourth switch ($SW_{31}$, $SW_{32}$, $SW_{33}$, $SW_{34}$) are provided with HV at all times.

Further, as illustrated in the embodiment 3A of Table 1, a twenty-first to a twenty-fourth switch ($SW_{21}$, $SW_{22}$, $SW_{23}$, $SW_{24}$) are provided with HV in a lump, under the condition that an eleventh to a fourteenth switch ($SW_{11}$, $SW_{12}$, $SW_{13}$, $SW_{14}$) are provided with MV.

Additionally, as illustrated in the embodiment 3B of Table 1, a twenty-first and a twenty-second switch ($SW_{21}$, $SW_{22}$) are provided with HV from a positive decoder 101 and a twenty-third and a twenty-fourth switch ($SW_{23}$, $SW_{24}$) are provided with MV selectively from a negative decoder 201, under the condition that an eleventh to a fourteenth switch ($SW_{11}$, $SW_{12}$, $SW_{13}$, $SW_{14}$) are provided with MV as described above.

As another alternative, as illustrated in the embodiment 3C of Table 1, a twenty-first to a twenty-fourth switches ($SW_{21}$, $SW_{22}$, $SW_{23}$, $SW_{24}$) are provided with MV in a lump, under the condition that an eleventh to a fourteenth switch ($SW_{11}$, $SW_{12}$, $SW_{13}$, $SW_{14}$) are provided with MV.

In these embodiments, the thirty-first to the thirty-fourth switch ($SW_{31}$, $SW_{32}$, $SW_{33}$, $SW_{34}$) are provided with HV at all times.

Further, each of the switches of the first to the third switch groups ($SW_{10}$, $SW_{20}$, $SW_{30}$) may be configured as a combination of transmission gates of transistors or as a combination of single transistors.

Therefore, the present includes a technology that is configured not to upsize a layout area of a display driver device, and to feature a high slew rate without increasing a current consumption. This goal is accomplished by using an output buffer and a switch whose construction is improved. For example, various embodiments allow selection of an input voltage of each of the switches and additional selections and related operations and actions to achieve the above benefits.

Figure 5:
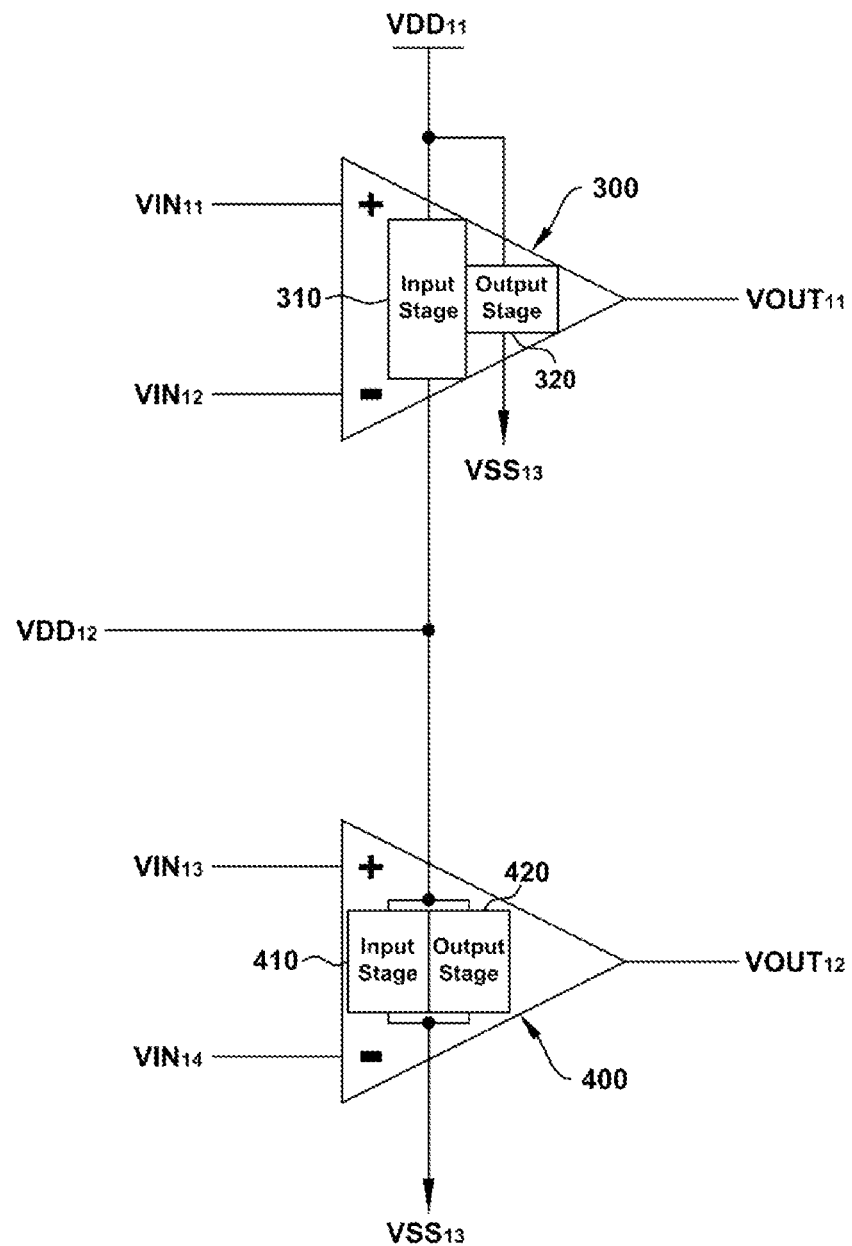
FIG. 5 illustrates a plan view of an apparatus for output buffering having a half-swing rail-to-rail structure, according to an embodiment.

FIG. 5 illustrates a plan view of an apparatus for output buffering having a half-swing rail-to-rail structure according to an embodiment.

As illustrated, the apparatus for output buffering having a half-swing rail-to-rail structure includes a first output buffer 300 and a second output buffer 400. In this example, the first output buffer 300 includes a first input signal ($VIN_{11}$), a second input signal ($VIN_{12}$) and a first output signal ($VOUT_{11}$). Also in this example, the second output buffer 400 having a third input signal ($VIN_{13}$), a fourth input signal ($VIN_{14}$) and a second output signal ($VOUT_{12}$).

The first output buffer 300 and the second output buffer 400 are driven by one or more voltages from the first voltage rail ($VDD_{11}$), the second voltage rail ($VDD_{12}$) and the third voltage rail ($VSS_{13}$), and the first and second Output Buffers 300, 400 operate using an operational structure that is constituted differently from the structure described in the embodiment of FIG. 3.

Thus, the first output buffer 300 is driven between the first voltage rail ($VDD_{11}$) and also the second and third Voltage Rails ($VDD_{12}$, $VSS_{13}$), and outputs the first output signal ($VOUT_{11}$) in response to the first input signal ($VIN_{11}$) and the second input signal ($VIN_{12}$). Furthermore, the second output buffer 400 is driven between the second voltage rail ($VDD_{12}$) and the third voltage rail ($VSS_{13}$), and outputs the second output signal ($VOUT_{12}$) in response to the third input signal ($VIN_{13}$) and the fourth input signal ($VIN_{14}$).

In this embodiment, the first output buffer 110 includes an input stage 310 and an output stage 320. The input stage 310 is configured to receive an input high power voltage and an input low power voltage from the first voltage rail ($VDD_{11}$) and the second voltage rail ($VDD_{12}$), and generates a delivery signal corresponding to an input signal. The output stage 320 is configured to receive an output high power voltage and an output low power voltage from the first voltage rail ($VDD_{11}$) and the third voltage rail ($VSS_{13}$), and outputs the second output signal corresponding to the delivery signal.

Therefore, in various examples, a voltage level of the output high power voltage is identical to that of the input high power voltage, and a voltage level of the output low power voltage is lower than that of the input low power voltage.

The second output buffer 400 includes an input stage 410 and an output stage 420. The input stage 410 is configured to receive an input high power voltage and an input low power voltage from the second voltage rail ($VDD_{12}$) and the third voltage rail ($VSS_{13}$), and generate a delivery signal corresponding to an input signal. The output stage 420 is configured to receive an output high power voltage and an output low power voltage from the second voltage rail ($VDD_{12}$) and the third voltage rail ($VSS_{13}$), and output the second output signal corresponding to the delivery signal.

Thus, in this example, the voltage level of the output high power voltage is identical to that of the input high power voltage, and the voltage level of the output low power voltage is identical to that of the input low power voltage.

In an example, a voltage value of the second voltage rail ($VDD_{12}$) is a half voltage value midway between the first voltage rail ($VDD_{11}$) and the third voltage rail ($VSS_{13}$).

Figure 6:
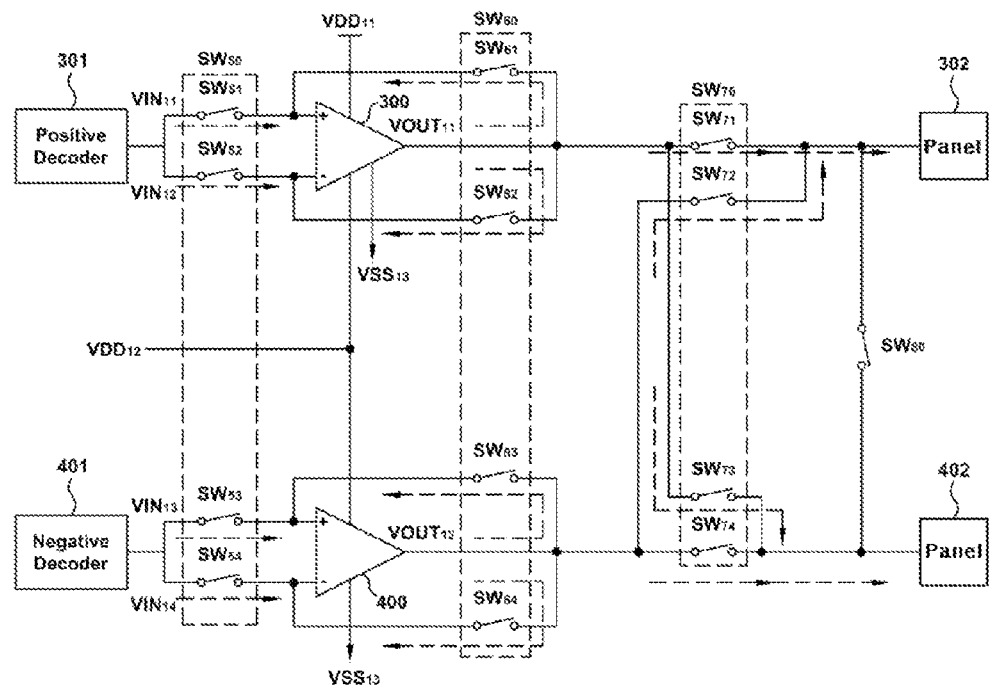
FIG. 6 illustrates a plan view indicating an apparatus in which a switch structure for an offset cancellation is added to the apparatus for output buffering illustrated in FIG. 5, according to an embodiment.

FIG. 6 illustrates a plan view indicating an apparatus in which a switch structure for offset cancellation is added to the apparatus for output buffering illustrated in FIG. 5, according to an embodiment.

As illustrated, circuits for supplying a voltage and for feedback are configured by adding a fifty-first to a fifty-fourth switch ($SW_{51}$, $SW_{52}$, $SW_{53}$, $SW_{54}$) and a sixty-first to sixty-fourth switch ($SW_{61}$, $SW_{62}$, $SW_{63}$, $SW_{64}$) to the first output buffer 300 and the second output buffer 400.

As explained regarding FIG. 5, a first output buffer 300 is driven between the first voltage rail ($VDD_{11}$) and the second and third Voltage Rails ($VDD_{12}$, $VSS_{13}$), and the first output buffer 300 outputs a first output signal ($VOUT_{11}$) in response to a first input signal ($VIN_{11}$) and a second input signal ($VIN_{12}$).

Thus, a fifty-first switch ($SW_{51}$) provides the first input signal ($VIN_{11}$) for the first input terminal (+) of the first output buffer 300. A fifty-second switch ($SW_{52}$) provides the second input signal ($VIN_{12}$) for the second input terminal (−) of the first input output buffer 300.

Further, as explained with respect to FIG. 5, the second output buffer 400 is driven between the second voltage rail ($VDD_{12}$) and the third voltage rail ($VSS_{13}$), and outputs a second output signal ($VOUT_{12}$) in response to the third input signal ($VIN_{13}$) and the fourth input signal ($VIN_{14}$).

Additionally, a fifty-third switch ($SW_{53}$) provides the third input signal ($VIN_{03}$) for the first input terminal (+) of the second output buffer 400. Also, a fifty-fourth switch ($SW_{54}$) provides the fourth input signal ($VIN_{04}$) for the second input terminal (−) of the second output buffer 210.

Furthermore, a sixty-first switch ($SW_{61}$) feeds back the first output signal ($VOUT_{01}$) to the first input terminal (+) of the first output buffer 300, a sixty-second switch ($SW_{62}$) feeds back the first output signal ($VOUT_{01}$) to the second input terminal (−) of the first output buffer 300, a sixty-third switch ($SW_{63}$) feeds back the second output signal ($VOUT_{02}$) to the first input terminal (+) of the second output buffer 400, and a sixty-forth switch ($SW_{64}$) feeds back the second output signal ($VOUT_{02}$) to the second input terminal (−) of the second output buffer 400.

Also, a seventy-first switch ($SW_{71}$) provides the first output signal ($VOUT_{01}$) for the first panel 302, a seventy-third switch ($SW_{73}$) provides the first output signal ($VOUT_{01}$) for the second panel 402, a seventy-second switch ($SW_{72}$) provides the second output signal ($VOUT_{02}$) for the first panel 302, and a seventy-fourth switch ($SW_{74}$) provides the second output signal ($VOUT_{02}$) for the second panel 402.

Further, an eightieth switch ($SW_{80}$) makes the first panel 302 and the second panel 402 separate from each other, so that they receive separate signals.

In this example, each of the switches is provided with voltage from the first voltage rail ($VDD_{01}$) and the second voltage rail ($VDD_{02}$), selectively. Suppliable combinations of input voltage according to various embodiments are presented below as Table 2.

TABLE 2

| Item | Fifth Switch Group SW50 | | | | Sixth Switch Group SW60 | | | | Seventh Switch Group SW70 | | | |
|---|---|---|---|---|---|---|---|---|---|---|---|---|
| Type of Decoder | Positive Decoder | | Negative Decoder | | Positive Decoder | | Negative Decoder | | Positive Decoder | | Negative Decoder | |
| Switch | $SW_{51}$ | $SW_{52}$ | $SW_{53}$ | $SW_{54}$ | $SW_{61}$ | $SW_{62}$ | $SW_{63}$ | $SW_{64}$ | $SW_{71}$ | $SW_{72}$ | $SW_{73}$ | $SW_{74}$ |
| Embodiment 4A | HV | HV | HV | HV | HV | HV | HV | HV | HV | HV | HV | HV |

TABLE 2-continued

| Item | Fifth Switch Group SW50 | | | | Sixth Switch Group SW60 | | | | Seventh Switch Group SW70 | | | |
|---|---|---|---|---|---|---|---|---|---|---|---|---|
| Type of Decoder | Positive Decoder | | Negative Decoder | | Positive Decoder | | Negative Decoder | | Positive Decoder | | Negative Decoder | |
| Switch | $SW_{51}$ | $SW_{52}$ | $SW_{53}$ | $SW_{54}$ | $SW_{61}$ | $SW_{62}$ | $SW_{63}$ | $SW_{64}$ | $SW_{71}$ | $SW_{72}$ | $SW_{73}$ | $SW_{74}$ |
| Embodiment 4B | | | | | HV | HV | MV | MV | | | | |
| Embodiment 4C | | | | | MV | MV | MV | MV | | | | |
| Embodiment 5A | HV | HV | MV | MV | HV | HV | HV | HV | | | | |
| Embodiment 5B | | | | | HV | HV | MV | MV | | | | |
| Embodiment 5C | | | | | MV | MV | MV | MV | | | | |
| Embodiment 6A | MV | MV | MV | MV | HV | HV | HV | HV | | | | |
| Embodiment 6B | | | | | HV | HV | MV | MV | | | | |
| Embodiment 6C | | | | | MV | MV | MV | MV | | | | |

In Table 2, HV denotes a supply voltage provided by a first voltage rail ($VDD_{01}$) and MV denotes a supply voltage provided by a second voltage rail ($VDD_{02}$).

Thus, in an example, the switches ($SW_{51}$, $SW_{52}$, $SW_{61}$, $SW_{62}$, $SW_{71}$, $SW_{72}$) are provided with the supply voltages of the first voltage rail ($VDD_{01}$) and the second voltage rail ($VDD_{02}$) selectively from a positive decoder 101, and the switches ($SW_{53}$, $SW_{54}$, $SW_{63}$, $SW_{64}$, $SW_{73}$, $SW_{34}$) are provided with the supply voltages of the first voltage rail ($VDD_{01}$) and the second voltage rail ($VDD_{02}$) selectively from a negative decoder 201.

Therefore, as illustrated in the embodiment 4A of Table 2, a sixty-first to a sixty-fourth switch ($SW_{61}$, $SW_{62}$, $SW_{63}$, $SW_{64}$) are provided with HV in a lump, under the condition that a fifty-first to a fifty-fourth switch ($SW_{51}$, $SW_{52}$, $SW_{53}$, $SW_{54}$) are provided with HV.

Meanwhile, as illustrated in the embodiment 4B of Table 2, a sixty-first and a sixty-second switch ($SW_{61}$, $SW_{62}$) are provided with HV from a positive decoder 301 and a sixty-third and a sixty-fourth switch ($SW_{63}$, $SW_{64}$) are provided with MV selectively from a negative decoder 401, under the condition that a fifty-first to a fifty-fourth switch ($SW_{51}$, $SW_{52}$, $SW_{53}$, $SW_{54}$) are provided with HV as described above.

In another example, as illustrated in the embodiment 4C of Table 2, a sixty-first to a sixty-fourth switch ($SW_{61}$, $SW_{62}$, $SW_{63}$, $SW_{64}$) are provided with MV in a lump, under the condition that a fifty-first to a fifty-fourth switch ($SW_{51}$, $SW_{52}$, $SW_{53}$, $SW_{54}$) are provided with HV.

In these embodiments, the seventy-first to the seventy-fourth switches ($SW_{71}$, $SW_{72}$, $SW_{73}$, $SW_{74}$) are provided with HV at all times.

Further, as illustrated in the embodiment 5A of Table 2, a sixty-first to a sixty-fourth switch ($SW_{61}$, $SW_{62}$, $SW_{63}$, $SW_{64}$) is provided with HV in a lump, under the condition that a fifty-first and a fifty-second switch ($SW_{51}$, $SW_{52}$) are provided with HV from a positive decoder 301 and a fifty-third and a fifty-fourth switch ($SW_{53}$, $SW_{54}$) are provided with MV selectively from a negative decoder 401.

As another example, as illustrated in the embodiment 5B of Table 2, a sixty-first and a sixty-second switch ($SW_{61}$, $SW_{62}$) are provided with HV from a positive decoder 301 and a sixty-third and a sixty-forth switch ($SW_{63}$, $SW_{64}$) are provided with MV selectively from a negative decoder 401, under the condition that a fifty-first and a fifty-second switch ($SW_{51}$, $SW_{52}$) are provided with HV from a positive decoder 301 and a fifty-third and a fifty-fourth switch ($SW_{53}$, $SW_{54}$) are provided with MV selectively from a negative decoder 401.

In another example, as illustrated in the embodiment 5C of Table 2, a sixty-first to a sixty-fourth switch ($SW_{61}$, $SW_{62}$, $SW_{63}$, $SW_{64}$) are provided with MV in a lump, under the condition that a fifty-first and a fifty-second switch ($SW_{51}$, $SW_{52}$) are provided with HV from a positive decoder 301 and a fifty-third and a fifty-fourth switch ($SW_{53}$, $SW_{54}$) are provided with MV selectively from a negative decoder 401.

In these embodiments, the seventy-first to the seventy-fourth switch ($SW_{71}$, $SW_{72}$, $SW_{73}$, $SW_{74}$) are provided with HV at all times.

Alternatively, as illustrated in the embodiment 6A of Table 2, a sixty-first to a sixty-fourth switch ($SW_{61}$, $SW_{62}$, $SW_{63}$, $SW_{64}$) are provided with HV in a lump, under the condition that a fifty-first to a fifty-fourth switch ($SW_{51}$, $SW_{52}$, $SW_{53}$, $SW_{54}$) are provided with MV.

Meanwhile, as illustrated in the embodiment 6B of Table 2, a sixty-first and a sixty-second switch ($SW_{61}$, $SW_{62}$) are provided with HV from a positive decoder 301 and a sixty-third and a sixty-fourth switch ($SW_{63}$, $SW_{64}$) are provided with MV selectively from a negative decoder 401, under the condition that a fifty-first to a fifty-fourth switch ($SW_{51}$, $SW_{52}$, $SW_{53}$, $SW_{54}$) are provided with MV as described above.

In another example, as illustrated in the embodiment 6C of Table 2, a sixty-first to a sixty-fourth switch ($SW_{61}$, $SW_{62}$, $SW_{63}$, $SW_{64}$) are provided with MV in a lump, under the condition that a fifty-first to a fifty-fourth switch ($SW_{51}$, $SW_{52}$, $SW_{53}$, $SW_{54}$) are provided with MV.

In these embodiments, the seventy-first to the seventy-fourth switch ($SW_{71}$, $SW_{72}$, $SW_{73}$, $SW_{74}$) are provided with HV at all times.

Further, each of the switches of the fifth to the seventh switch groups ($SW_{50}$, $SW_{60}$, $SW_{70}$) may be configured as a combination of transmission gates of transistors or as a combination of single transistors.

Therefore, various embodiments are configured not to upsize a layout area of a display driver device. Based Therefore, various embodiments are capable of featuring a high slew rate without increasing a current consumption as an output buffer and a switch structure thereof are improved as provided in embodiments.

Figure 7:
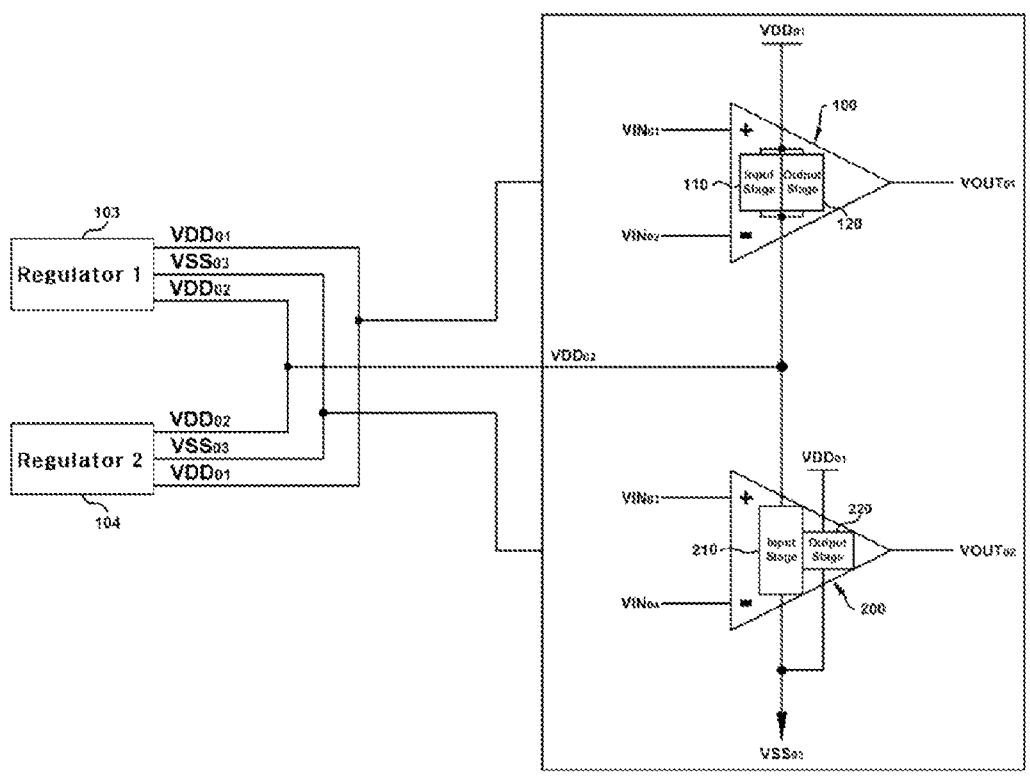
FIG. 7 illustrates a plan view of a power supply structure according to the apparatus for output buffering illustrated in FIG. 3, according to an embodiment.

FIG. 7 illustrates a plan view of a power supply structure according to the apparatus for output buffering illustrated in FIG. 3, according to an embodiment.

As illustrated, a structure for supplying power to the apparatus for output buffering having a half-swing rail-to-rail structure according to the present disclosure drives the second output buffer 200 and the first output buffer 100 by selectively providing the output buffers with voltage from a first voltage rail ($V_{O1}$), a second voltage rail ($V_{O2}$) and a third voltage rail ($V_{O3}$) that originates from a first regulator 103 and/or a second regulator 104 formed on an external printed circuit board (PCB) (not illustrated) or IC.

Figure 8:
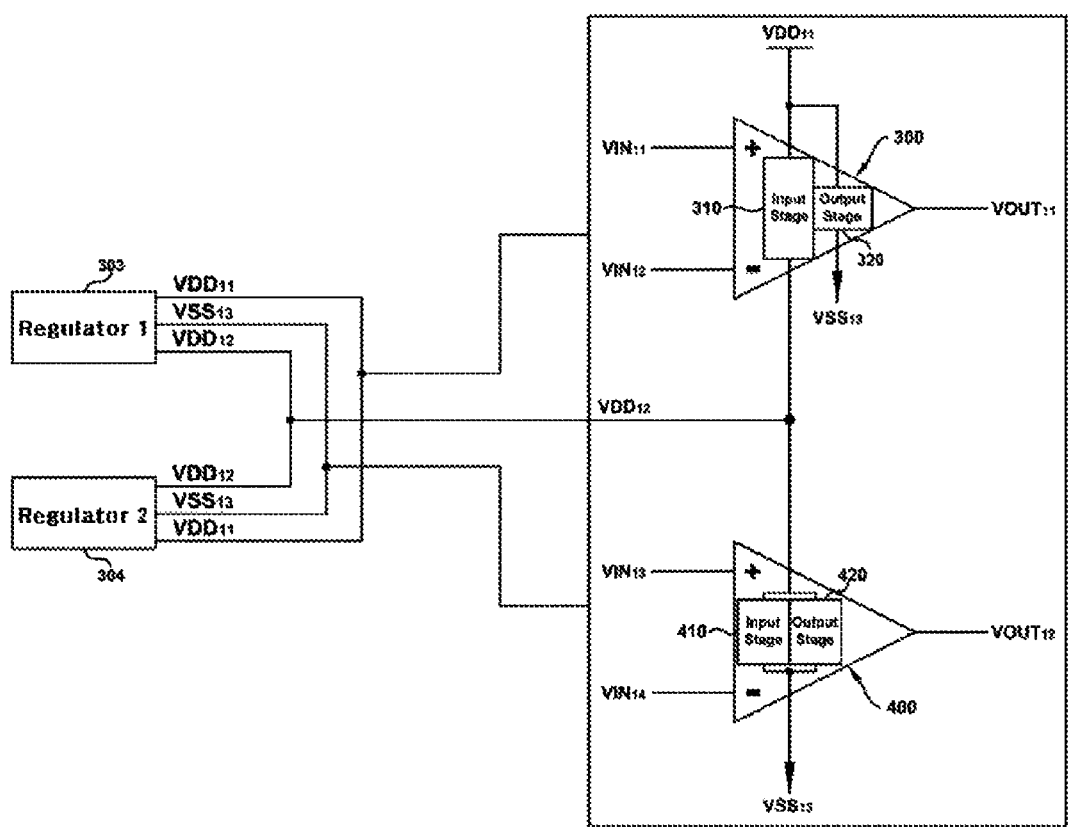
FIG. 8 illustrates a plan view of a power supply structure according to the apparatus for output buffering illustrated in FIG. 5, according to an embodiment.

FIG. 8 illustrates a plan view of a power supply structure according to the apparatus for output buffering illustrated in FIG. 5, according to an embodiment.

As illustrated, the power supply structure of the apparatus for output buffering having a half-swing rail-to-rail structure according to the present disclosure drives the second output buffer 400 of the first output buffer 300 by being provided with voltages from the first voltage rail ($VDD_{11}$), the second voltage rail ($VDD_{12}$) and the third voltage rail ($VSS_{13}$) selectively from the first regulator 303 and the second regulator 304 formed on the external PCB (not illustrated) or IC.

The image display apparatus may be implemented as a liquid crystal display (LCD), a light-emitting diode (LED) display, a plasma display panel (PDP), a screen, a terminal, and the like. A screen may be a physical structure that includes one or more hardware components that provide the ability to render a user interface and/or receive user input. The screen can encompass any combination of display region, gesture capture region, a touch sensitive display, and/or a configurable area. The screen can be embedded in the hardware or may be an external peripheral device that may be attached and detached from the apparatus. The display may be a single-screen or a multi-screen display. A single physical screen can include multiple displays that are managed as separate logical displays permitting different content to be displayed on separate displays although part of the same physical screen.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a hardware component may include multiple processors or a processor and a controller. In addition, different processing configurations are possible, such as parallel processors.

The methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The media may also include, alone or in combination with the software program instructions, data files, data structures, and the like. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

As a non-exhaustive illustration only, a terminal/device/unit described herein may refer to mobile devices such as, for example, a cellular phone, a smart phone, a wearable smart device (such as, for example, a ring, a watch, a pair of glasses, a bracelet, an ankle bracket, a belt, a necklace, an earring, a headband, a helmet, a device embedded in the cloths or the like), a personal computer (PC), a tablet personal computer (tablet), a phablet, a personal digital assistant (PDA), a digital camera, a portable game console, an MP3 player, a portable/personal multimedia player (PMP), a handheld e-book, an ultra mobile personal computer (UMPC), a portable lab-top PC, a global positioning system (GPS) navigation, and devices such as a high definition television (HDTV), an optical disc player, a DVD player, a Blue-ray player, a setup box, or any other device capable of wireless communication or network communication consistent with that disclosed herein. In a non-exhaustive example, the wearable device may be self-mountable on the body of the user, such as, for example, the glasses or the bracelet. In another non-exhaustive example, the wearable device may be mounted on the body of the user through an attaching device, such as, for example, attaching a smart phone or a tablet to the arm of a user using an armband, or hanging the wearable device around the neck of a user using a lanyard.

A computing system or a computer may include a microprocessor that is electrically connected to a bus, a user interface, and a memory controller, and may further include a flash memory device. The flash memory device may store N-bit data via the memory controller. The N-bit data may be data that has been processed and/or is to be processed by the microprocessor, and N may be an integer equal to or greater than 1. If the computing system or computer is a mobile device, a battery may be provided to supply power to operate the computing system or computer. It will be apparent to one of ordinary skill in the art that the computing system or computer may further include an application chipset, a camera image processor, a mobile Dynamic Random Access Memory (DRAM), and any other device known to one of ordinary skill in the art to be included in a computing system or computer. The memory controller and the flash memory device may constitute a solid-state drive or disk (SSD) that uses a non-volatile memory to store data.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus for output buffering having a half-swing rail-to-rail structure, comprising:
    a first output buffer configured to:
    be driven between a first voltage rail and a second voltage rail, and
    output a first output signal in response to a first input signal and a second input signal; and
    a second output buffer configured to:
    be driven between the first and the second voltage rails and a third voltage rail, and
    output a second output signal in response to a third input signal and a fourth input signal.

2. The apparatus of claim 1,
    wherein the second output buffer comprises:
    an input stage configured to:
    receive an input high power voltage and an input low power voltage from the second voltage rail and the third voltage rail, respectively, and
    generate a delivery signal corresponding to an input signal; and
    an output stage configured to:
    receive an output high power voltage and an output low power voltage from the first voltage rail and the third voltage rail, respectively, and
    output the second output signal corresponding to the delivery signal.

3. The apparatus of claim 2,
    wherein a voltage level of the output high power voltage is higher than that of the input high power voltage, and
    wherein a voltage level of the output low power voltage is identical to that of the input low power voltage.

4. The apparatus of claim 1,
    wherein the first output buffer comprises:
    an input stage configured to:
    receive an input high power voltage and an input low power voltage from the first voltage rail and the second voltage rail, and
    generate a delivery signal corresponding to an input signal; and
    an output stage configured to:
    receive an output high power voltage and an output low power voltage from the first voltage rail and the second voltage rail, and
    output the first output signal corresponding to the delivery signal.

5. The apparatus of claim 4,
    wherein a voltage level of the output high power voltage is identical to that of the input high power voltage, and
    wherein a voltage level of the output low power voltage is identical to that of the input low power voltage.

6. The apparatus of claim 1,
    wherein a voltage value of the second voltage rail is a half voltage value between the first voltage rail and the third voltage rail.

7. An apparatus for output buffering having a half-swing rail-to-rail structure comprising:
    a first output buffer configured to:
    be driven between a first voltage rail and a second voltage rail, and
    output a first output signal in response to a first input signal and a second input signal;
    a first switch configured to provide the first input signal for a first input terminal of the first output buffer;
    a second switch configured to provide the second input signal for a second input terminal of the first output buffer;
    a second output buffer configured to:
    be driven between the first, second voltage rails and the third voltage rail, and
    output a second output signal in response to a third input signal and a fourth input signal;
    a third switch configured to provide the third input signal for the first input terminal of the second output buffer; and
    a fourth switch configured to provide the fourth input signal for the second input terminal of the second output buffer.

8. The apparatus of claim 7, further comprising:
    a fifth switch configured to feed back the first output signal to the first input terminal of the first output buffer;
    a sixth switch configured to feed back the first output signal to the second input terminal of the first output buffer;
    a seventh switch configured to feed back the second output signal to the first input terminal of the second output buffer; and
    an eighth switch configured to feed back the second output signal to the second input terminal of the second output buffer.

9. The apparatus of claim 8, further comprising:
    a ninth switch configured to provide the first output signal for the first panel;
    a tenth switch configured to provide the first output signal for the second panel;
    an eleventh switch configured to provide the second output signal for the first panel; and
    a twelfth switch configured to provide the second output signal for the second panel.

10. The apparatus of claim 9,
    wherein each switch of the first to fourth switch, the fifth to eighth switch, and the ninth to twelfth switch are provided with voltage from the first voltage rail and the second voltage rail by a positive decoder and a negative decoder, the first and second switch are both provided with voltage from the first voltage rail or the second voltage rail by the positive decoder and the fifth and sixth switch are both provided with voltage from the first voltage rail or the second voltage rail by the positive decoder, the third and fourth switch are both provided with voltage from the first voltage rail or the second voltage rail by the negative decoder and the seventh and eighth switch are both provided with voltage from the first voltage rail or the second voltage rail by the negative decoder, and the ninth and eleventh switch are both provided with voltage from the first voltage rail by the positive decoder and the tenth and twelfth switch are both provided with voltage from the first voltage rail by the negative decoder.

11. The apparatus of claim 9, further comprising:
a thirteenth switch configured to make the first panel and the second panel separate from each other.

12. The apparatus of claim 7, further comprising:
a plurality of regulators, formed at an external printed circuit board (PCB) or integrated circuit (IC), and connected in a row to selectively provide a driving voltage for the first to the third voltage rails.

13. An apparatus for output buffering having a half-swing rail-to-rail structure, comprising:
a first output buffer configured to:
be driven between the first voltage rail and the second, third voltage rails, and
output a first output signal in response to a first input signal and a second input signal; and
a second output buffer configured to:
be driven between the second voltage rail and the third voltage rail, and
output a second output signal in response to the third input signal and the fourth input signal.

14. The apparatus of claim 13,
wherein the first output buffer comprises:
an input stage configured to:
receive an input high power voltage and an input low power voltage from the first voltage rail and the second voltage rail, and
generate a delivery signal corresponding to an input signal; and
an output stage configured to:
receive an output high power voltage and an output low power voltage from the first voltage rail and the third voltage rail, and
output the second output signal corresponding to the delivery signal.

15. The apparatus of claim 14,
wherein a voltage level of the output high power voltage is identical to that of the input high power voltage, and
wherein a voltage level of the output low power voltage is lower than that of the input low power voltage.

16. The apparatus of claim 13,
wherein the second output buffer comprises:
an input stage configured to:
receive an input high power voltage and an input low power voltage from the second voltage rail and the third voltage rail, and
generate a delivery signal corresponding to an input signal; and
an output stage configured to:
receive an output high power voltage and an output low power voltage from the second voltage rail and the third voltage rail, and
output the second output signal corresponding to the delivery signal.

17. The apparatus of claim 16,
wherein the voltage level of the output high power voltage is identical to that of the input high power voltage, and
wherein the voltage level of the output low power voltage is identical to that of the input low power voltage.

18. The apparatus of claim 13,
wherein a voltage value of the second voltage rail is a half voltage value between the first voltage rail and the third voltage rail.

19. An apparatus for output buffering having a half-swing rail-to-rail structure, comprising:
a first output buffer configured to:
be driven between the first voltage rail, the second voltage rail, and the third voltage rail, and
output a first output signal in response to a first input signal and a second input signal;
a first switch configured to provide the first input signal for the first input terminal of the first output buffer;
a second switch configured to provide the second input signal for the second input terminal of the first output buffer;
a second output buffer configured to:
be driven between the second voltage rail and the third voltage rail, and
output a second output signal in response to the third input signal and the fourth input signal;
a third switch configured to provide the third input signal for the first input terminal of the second output buffer; and
a fourth switch configured to provide the fourth input signal for the second input terminal of the second output buffer.

20. The apparatus of claim 19, further comprising:
a fifth switch configured to feed back the first output signal to the first input terminal of the first output buffer;
a sixth switch configured to feed back the first output signal to the second input terminal of the first output buffer;
a seventh switch configured to feed back the second output signal to the first input terminal of the second output buffer; and
an eighth switch configured to feed back the second output signal to the second input terminal of the second output buffer.

21. The apparatus of claim 20, further comprising:
a ninth switch configured to provide the first output signal for the first panel;
a tenth switch configured to provide the first output signal for the second panel;
an eleventh switch configured to provide the second output signal for the first panel; and
a twelfth switch configured to provide the second output signal for the second panel.

22. The apparatus of claim 20,
wherein each switch of the first to fourth switch, the fifth to eighth switch, and the ninth to twelfth switch are provided with voltage from the first voltage rail and the second voltage rail by a positive decoder and a negative decoder, the first and second switch are both provided with voltage from the first voltage rail or the second voltage rail by the positive decoder and the fifth and sixth switch are both provided with voltage from the first voltage rail or the second voltage rail by the positive decoder, the third and fourth switch are both provided with voltage from the first voltage rail or the second voltage rail by the negative decoder and the seventh and eighth switch are both provided with voltage from the first voltage rail or the second voltage rail by the negative decoder, and the ninth and eleventh switch are both provided with voltage from the first voltage rail by the positive decoder and the tenth and twelfth switch are both provided with voltage from the first voltage rail by the negative decoder.

23. The apparatus of claim 20, further comprising:
a thirteenth switch making the first panel and the second panel separate from each other.

24. The apparatus of claim 19, further comprising:
a first regulator and a second regulator, formed at an external printed circuit board (PCB) or integrated circuit (IC) configured to:
selectively provide a driving voltage for the first to the third voltage rails.

* * * * *